United States Patent
Katsumura et al.

(10) Patent No.: US 6,849,390 B2
(45) Date of Patent: Feb. 1, 2005

(54) STAMPER-FORMING ELECTRODE MATERIAL, STAMPER-FORMING THIN FILM, AND METHOD OF MANUFACTURING OPTICAL DISK

(75) Inventors: Masahiro Katsumura, Tsurugashima (JP); Tetsuya Iida, Tsurugashima (JP); Nobuhiro Oda, Tokyo-to (JP); Takashi Ueno, Tokyo-to (JP)

(73) Assignee: Pioneer Corporation, Tokyo-To (JP)

( * ) Notice: Subject to any disclaimer, the term of this patent is extended or adjusted under 35 U.S.C. 154(b) by 341 days.

(21) Appl. No.: 10/061,273

(22) Filed: Feb. 4, 2002

(65) Prior Publication Data

US 2002/0150840 A1 Oct. 17, 2002

(30) Foreign Application Priority Data

Feb. 5, 2001 (JP) .................................... P2001-028454
Feb. 5, 2001 (JP) .................................... P2001-028455

(51) Int. Cl.$^7$ ............................. G11B 7/26; B32B 3/00
(52) U.S. Cl. ....................... 430/320; 430/321; 264/106; 264/107
(58) Field of Search ................................. 430/320–322; 427/512; 264/106, 107; 205/68–70; 428/64.1; 438/781

(56) References Cited

U.S. PATENT DOCUMENTS

| | | | | |
|---|---|---|---|---|
| 3,553,085 A | * | 1/1971 | Heymann et al. | ........... 205/167 |
| 4,661,212 A | | 4/1987 | Ehrfeld et al. | |
| 5,001,035 A | * | 3/1991 | van Liempd et al. | ........ 430/321 |
| 5,073,237 A | | 12/1991 | Bacher et al. | |
| 5,776,636 A | * | 7/1998 | Kunisawa et al. | ............. 430/5 |

FOREIGN PATENT DOCUMENTS

EP 0 561 080 A1 9/1993

* cited by examiner

*Primary Examiner*—Mark F. Huff
*Assistant Examiner*—Kripa Sagar
(74) *Attorney, Agent, or Firm*—Sughrue Mion, PLLC

(57) ABSTRACT

A stamper-forming electrode material contains Cu as its main ingredient and at least one other element, preferably Ag and/or Ti. It is preferred that the Ag content be 10.0 wt % or less and that the Ti content be 5.0 wt % or less. A stamper-forming thin film is made of this stamper-forming electrode material, whereby its corrosion resistance is improved to suppress damage to itself, and a high-quality stamper can hence be formed.

3 Claims, 2 Drawing Sheets

US 6,849,390 B2

STAMPER-FORMING ELECTRODE MATERIAL, STAMPER-FORMING THIN FILM, AND METHOD OF MANUFACTURING OPTICAL DISK

BACKGROUND OF THE INVENTION

1. Field of the Invention

The present invention relates to a stamper-forming thin film used to form a stamper which is a mold for mass production of optical disks such as compact disks (CDs) and digital versatile disks (DVDs), and to a stamper-forming electrode material for making the stamper-forming thin film. More particularly, the invention is directed to a stamper-forming thin film used as an electrode for forming the stamper by electroforming, and to a stamper-forming electrode material for making the electrode. The invention also relates to a method of manufacturing optical disks such as CDs or DVDs using the stamper.

2. Description of Related Art

To manufacture optical disks such as CDs or DVDs by a prior art technique, first, as shown in FIG. 3A, a resist film 102 is formed by spin coating or the like on a polished, smooth and flat surface of a supporting plate 101 made of glass. Then, this resist film 102 is patterned. For the patterning, as shown in FIG. 3B, the resist film 102 is exposed to a laser beam to form a latent image 102a, which is thereafter developed. As a result, a pattern 102b of grooves, or otherwise referred to as a grooved pattern 102b, is formed in the surface of the resist film 102, as shown in FIG. 3C.

After the patterning, as shown in FIG. 3D, an electrode film 103 made of a metallic material is deposited on the resist film 102 by sputtering, evaporation, or the like in a manner applying a coating over the entire part of the grooved pattern 102b. The electrode film 103 is made of a single metallic material, nickel (Ni), which is highly conductive and hard to change in composition after film formation, into a uniform thickness. Thereafter, as shown in FIG. 3E, a Ni metallic layer 104 is stacked on the electrode film 103 by electroforming using the film 103 as an electrode.

Then, as shown in FIG. 3F, the metallic layer 104 is separated, together with the electrode film 103, from the surface of the resist film 102 to produce a stamper 104a which is a monolithic member consisting of the electrode film 103 and the metallic layer 104. A surface of the stamper 104a has a pattern 104b of projections, or otherwise referred to as a projected pattern 104b, which has been transferred as the inverse of the grooved pattern 102b. Then, a synthetic resin material is injected into the stamper 104a as a mold toward its projected pattern 104b, to form a substrate on which a grooved pattern exactly identical with the grooved pattern 102b has been copied. Thereafter, a reflector film, a protective layer, etc. are stacked on the substrate in a manner coating the copied grooved pattern, to complete the manufacture of an optical disk.

By the way, latest versions of optical disks are required to have a greater recording density per unit area in order to increase their storage capacity without increasing their size, as in DVDs versus CDs, for example. To meet this requirement, an electron beam is replacing a laser beam during the patterning to implement a narrower groove width, for formation of a higher-definition grooved pattern 102b. For electron-beam exposure, electron-attracting elements such as chlorine, sulphur and fluorine, groups having an electron-attracting function (electron-attracting groups) or the like are added to a resist material for forming the resist film 102b, to provide the resist film 102b with improved electron absorption sensitivity.

However, the use of the resist film 102 with improved electron absorption sensitivity may cause damage, such as deterioration, to the electrode film 103 during electroforming for stacking the metallic layer 104 on the electrode film 103, due to Ni in the electrode film 103 reacting with the electron-attracting elements or groups. Since the surface of the projected pattern 104b of the stamper 104a is formed of the electrode film 103, the damaged electrode film 103 roughens the surface of the projected pattern 104b of the stamper 104a. Thus, such a stamper 104a cannot transfer the grooved pattern 102b to the substrate accurately, resulting in replication of low-performance optical disks with low signal-to-noise ratio (SNR) due to greater noise during data reading.

SUMMARY OF THE INVENTION

The invention has been made in view of the above problems addressed by the prior art. An object of the invention is, therefore, to provide a stamper-forming electrode material and a stamper-forming thin film with improved corrosion resistance to suppress damage to the stamper-forming thin film and hence allow a high-quality stamper to be formed.

Another object of the invention is to provide a method of manufacturing an optical disk with improved SNR and hence with high performance by improving the corrosion resistance of the stamper-forming thin film to suppress damage to the stamper-forming thin film and hence allow a high-quality stamper to be formed.

The above object of the present invention can be achieved by a stamper-forming electrode material of the present invention. The stamper-forming electrode material constitutes a stamper-forming thin film to be coated on a surface of a resist film patterned on a supporting plate, for forming a stamper by stacking a metallic layer on a surface of said stamper-forming thin film by electroforming using said stamper-forming thin film as an electrode, and thereafter by separating said metallic layer from said resist film, together with said stamper-forming thin film. Further, the material contains copper (Cu) as a main ingredient thereof and at least one other element.

According to the present invention, corrosion resistance is improved, whereby damage to a stamper-forming thin film is suppressed and a high-quality stamper can hence be formed.

In one aspect of the present invention, said other element is at least one of silver (Ag) and titanium (Ti).

According to this aspect, in addition to the above-mentioned advantages, a good corrosion resistance can be given to a stamper-forming thin film.

In another aspect of the present invention, said material contains Ag in an amount of 10.0 wt % or less.

According to this aspect, in addition to the above-mentioned advantages, a better corrosion resistance can be given to a stamper-forming thin film.

In further aspect of the present invention, said material contains Ti in an amount of 5.0 wt % or less.

According to this aspect, in addition to the above-mentioned advantages, an even better corrosion resistance can be given to a stamper-forming thin film.

The above object of the present invention can be achieved by a stamper-forming thin film of the present invention to be coated on a surface of a resist film patterned on a supporting plate. The stamper-forming thin film is provided with a stamper-forming electrode material for forming a stamper by stacking a metallic layer on a surface of said stamper-forming thin film by electroforming using said stamper-forming thin film as an electrode, and thereafter by separating said metallic layer from said resist film, together with said stamper-forming thin film. Further, the material contains copper (Cu) as a main ingredient thereof and at least one other element.

According to the present invention, corrosion resistance is improved, whereby damage to a stamper-forming thin film is suppressed and a high-quality stamper can hence be formed.

In one aspect of the present invention, said other element is at least one of silver (Ag) and titanium (Ti).

According to this aspect, in addition to the above-mentioned advantages, a good corrosion resistance can be given to a stamper-forming thin film.

In another aspect of the present invention, said material contains Ag in an amount of 10.0 wt % or less.

According to this aspect, in addition to the above-mentioned advantages, a better corrosion resistance can be given to a stamper-forming thin film.

In further aspect of the present invention, said material contains Ti in an amount of 5.0 wt % or less.

According to this aspect, in addition to the above-mentioned advantages, an even better corrosion resistance can be given to a stamper-forming thin film.

The above object of the present invention can be achieved by a method of manufacturing an optical disk of the present invention. The method is provided with the steps of: forming a resist film on a surface of a supporting plate; forming a predetermined pattern on said resist film by exposure to an electron beam; forming a stamper-forming thin film made of a stamper-forming electrode material on a surface of said patterned resist film; stacking a metallic layer on a surface of said stamper-forming thin film by electroforming using said stamper-forming thin film as an electrode, and thereafter by separating said metallic layer from said resist film, together with said stamper-forming thin film, to form a stamper; injection-molding a substrate made of a synthetic resin using said stamper as a mold; and stacking a reflector film and a protective layer on a surface of said substrate to manufacture said optical disk. Further, said stamper-forming electrode material of which said stamper-forming thin film is made contains Cu as a main ingredient thereof, and has at least one other element added to Cu.

According to the present invention, the corrosion resistance of a stamper-forming thin film is improved to form a high-quality stamper, whereby an optical disk can be manufactured which has improved SNR and hence maintains high performance.

In one aspect of the present invention, said other element is at least one of silver (Ag) and titanium (Ti).

According to this aspect, in addition to the above-mentioned advantages, a good corrosion resistance can be given to a stamper-forming thin film.

In another aspect of the present invention, said material contains Ag in an amount of 10.0 wt % or less.

According to this aspect, in addition to the above-mentioned advantages, a better corrosion resistance can be given to a stamper-forming thin film.

In further aspect of the present invention, said material contains Ti in an amount of 5.0 wt % or less.

According to this aspect, in addition to the above-mentioned advantages, an even better corrosion resistance can be given to a stamper-forming thin film.

DETAILED DESCRIPTION OF THE PREFERRED EMBODIMENTS

Preferred embodiments of the present invention will be described below with reference to FIGS. 1 and 2.

Figure 2A:
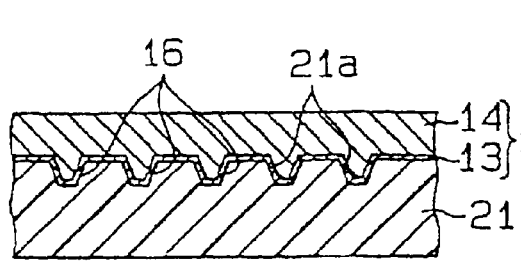
FIG. 2A is a sectional view showing the step of forming a substrate using the stamper.
Figure 2B:
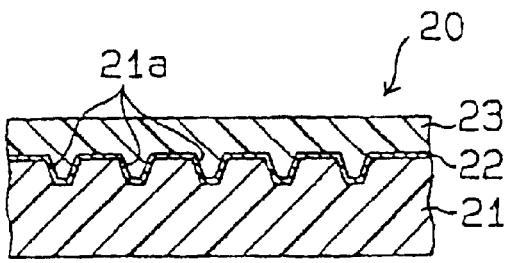
FIG. 2B is a sectional view showing the optical disk.
Figure 3A:
FIG. 3A is a sectional view showing the step of forming a resist film on a supporting plate in a prior art method of manufacturing an optical disk.
Figure 3B:
FIG. 3B is a sectional view showing the step of forming a latent image on the resist film in the prior art method.
Figure 3C:
FIG. 3C is a sectional view showing the step of developing the latent image in the prior art method.
Figure 3D:
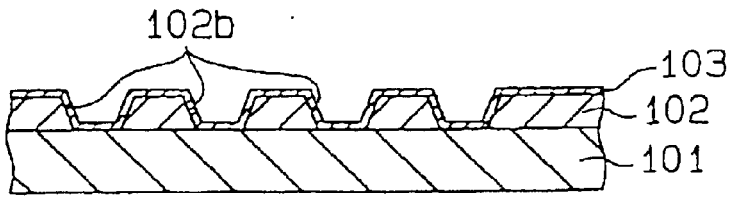
FIG. 3D is a sectional view showing the step of forming an electrode film on the resist film in the prior art method.
Figure 3E:
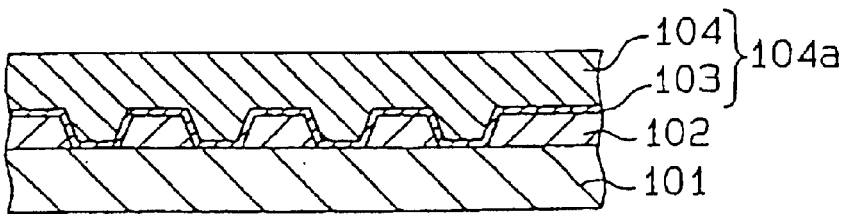
FIG. 3E is a sectional view showing the step of forming a metallic layer on the electrode film by electroforming in the prior art method.
Figure 3F:
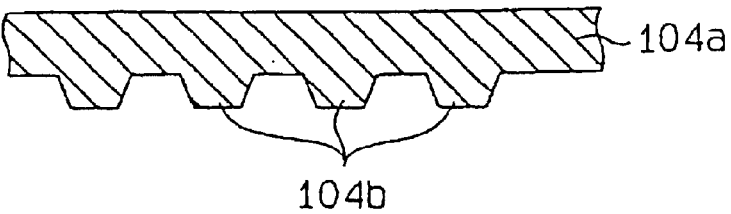
FIG. 3F is a sectional view showing a prior art stamper.

Referring now to FIG. 2B, a substrate 21, which constitutes an optical disk 20, is a transparent disk-shaped member made of a synthetic resin (polycarbonate), and its upper surface contains a pattern 21a of tiny grooves, or otherwise referred to as a grooved pattern 21a. On the substrate 21, a reflector film 22, which is an aluminum (Al) thin film, is stacked in a manner coating each groove of the pattern 21a. On the reflector film 22, a protective layer 23 made of a UV curable resin is stacked in a manner applying a coating over the entire surface of the substrate 21 while burying each groove of the pattern 21a. The protective layer 23 protects both the grooved pattern 21a and the reflector film 22 against damage.

Referring then to FIG. 2A, the substrate 21 is formed using a metallic stamper 15 molded by a method to be described below. The stamper 15 is formed into a monolithic member by stacking an electrode film 13 on a Ni metallic layer 14. The electrode film 13 is a stamper-forming thin film made of a metallic material (stamper-forming electrode material) and is formed below the metallic layer 14. The lower surface of the stamper 15 has a pattern 16 of projections, or otherwise referred to as a projected pattern 16, which is the inverse of the grooved pattern 21a provided in the substrate 21. To mold the substrate 21, a polycarbonate material is injected into the stamper 15 as a mold toward the projected groove 16 on its lower surface, and the polycarbonate part is then released from the stamper 15 after hardened.

To manufacture the optical disk 20, the reflector film 22 is deposited on the injection-molded substrate 21 by sputtering, evaporation or the like, and then the protective layer 23 is formed on the reflector film 22.

Figure 1A:
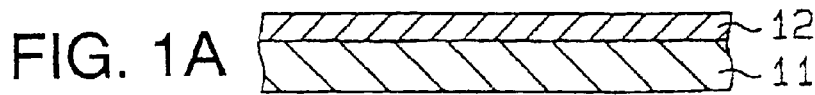
FIG. 1A is a sectional view showing the step of forming a resist film on a supporting plate in a method of manufacturing an optical disk according to an embodiment of the invention.

The method of molding the stamper 15 will be described. As shown in FIG. 1A, first, a resist film 12 is formed on a supporting plate 11. A polished, cleaned, smooth and flat surface of the supporting plate 11 made of a glass plate or a silicon wafer is, for example, spin-coated with a liquid resist material to a uniform thickness, and then prebaked for drying the resist material to form the resist film 12 thereon. The resist material contains electron-attracting elements such as chlorine, sulphur and fluorine, or electron-attracting groups, and thus the deposited resist film 12 has improved electron absorption sensitivity.

Figure 1B:
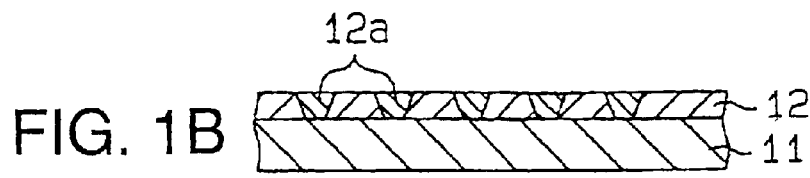
FIG. 1B is a sectional view showing the step of forming a latent image on the resist film in the method of the invention.
Figure 1C:
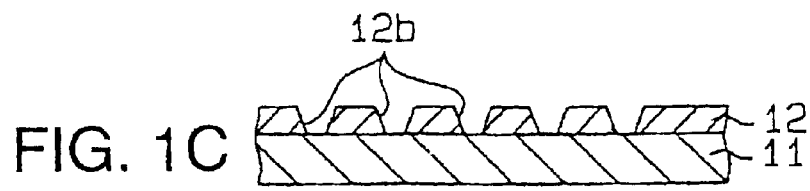
FIG. 1C is a sectional view showing the step of developing the latent image in the method of the invention.

Then, the resist film 12 is patterned. As shown in FIG. 1B, the resist film 12 is exposed to an electron beam from top to form a latent image 12a on its surface, whereby data signals are recorded. Then, as shown in FIG. 1C, the resist film 12 is developed to remove the latent image 12a portion, whereby a pattern 12b of grooves, or a grooved pattern 12b, is provided therein. Successively, the resultant resist film 12 is postbaked to complete its patterning step.

Figure 1D:
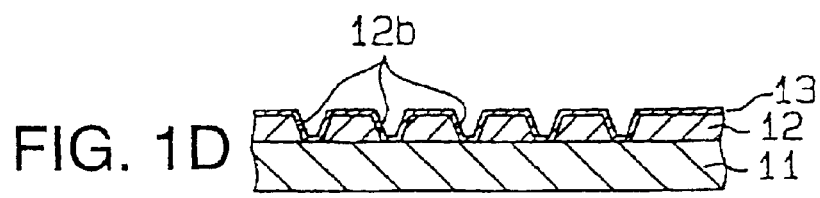
FIG. 1D is a sectional view showing the step of forming an electrode film on the resist film in the method of the invention.

Then, as shown in FIG. 1D, the electrode film 13 made of the stamper-forming electrode material (metallic material) as the stamper-forming thin film is deposited on the upper surface of the resist film 12 to a uniform thickness by a process such as sputtering, evaporation, or electroless plating. At this stage, the shape of the grooved pattern 12b has been accurately transferred to the electrode film 13.

Figure 1E:
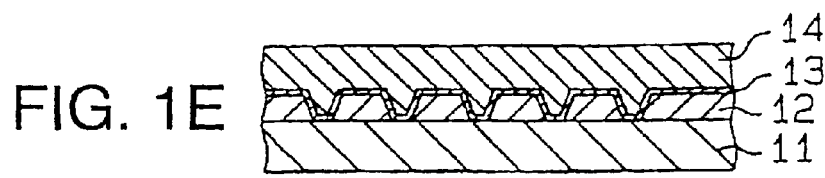
FIG. 1E is a sectional view showing the step of forming a metallic layer on the electrode film by electroforming in the method of the invention.
Figure 1F:
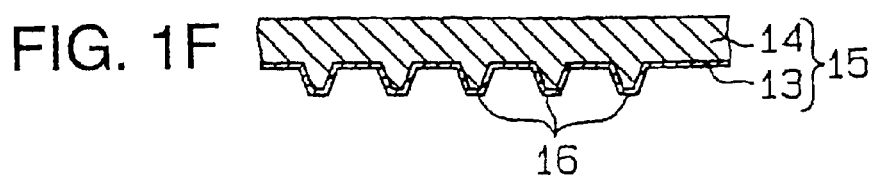
FIG. 1F is a sectional view showing a stamper of the invention.

Lastly, the stamper 15 is formed. As shown in FIG. 1E, electroforming is performed using the electrode film 13 as an electrode to deposit Ni on the electrode film 13 as the metallic layer 14. Thereafter, this metallic layer 14 is separated, together with the electrode film 13, from the surface of the resist film 12 and supporting plate 11, to obtain the stamper 15 in the form of a monolithic member consisting of the metallic layer 14 and the electrode film 13, as shown in FIG. 1F.

The lower surface of the stamper 15 is provided, through the electrode film 13, with the projected pattern 16 which is the exact opposite of the grooved pattern 12b accurately transferred to the electrode film 13. This stamper 15 is thus used to injection-mold the substrate 21 that constitutes the optical disk 20, as mentioned above.

Once formed, the stamper 15 may subsequently be used as a master stamper to prepare a submaster stamper having the grooved pattern, by electroforming its surface provided with the projected pattern 16. Thereafter, a plurality of baby stampers each being identical in shape with the master stamper are prepared using the submaster stamper, to replicate the substrates 21 of optical disks 20 by injection molding.

The stamper-forming electrode material (metallic material) for making the electrode film 13 contains copper (Cu) as its main ingredient, and at least one other element. Copper is contained because it is highly conductive and less susceptible to chemical reaction with the electron-attracting elements or groups present in the resist material. The term "main ingredient" herein means an ingredient contained most in the stamper-forming electrode material. The at least one other element is selected preferably from silver (Ag) and titanium (Ti) which can easily improve the corrosion resistance of the electrode film 13 as the stamper-forming thin film. Other than Ag and Ti, at least one element may be selected from palladium (Pd), zirconium (Zr), Ni, silicon (Si), Al, chromium (Cr), platinum (Pt), and gold (Au).

The stamper-forming electrode material according to this embodiment contains Cu as its main ingredient, and Ag and Ti selected from the above-listed metallic elements as additives. The addition of Ag and Ti to the stamper-forming electrode material contributes to improving the corrosion resistance of the electrode film 13 to electron-attracting elements such as chlorine, sulphur and fluorine, or substances containing such elements as electron-attracting groups, while maintaining the conductivity of the film 13.

The element Ag is added to the stamper-forming electrode material preferably in an amount of 10.0 percent by weight (wt %) or less, or more preferably 5.0 wt % or less. The Ag content greater than 10.0 wt % may make Ag hard to form colloidal mixtures with Cu and Ti depending on how they are contained to compose the material, or may produce a metallic material with unstable properties or with an undesired corrosion resistance. Moreover, the Ti content in the stamper-forming electrode material is set preferably to 5.0 wt % or less, more preferably to 2.0 wt % or less, or even more preferably to 1.0 wt % or less. The Ti content greater than 5.0 wt % may make Ti hard to form colloidal mixtures with Cu and Ag depending on how they are contained to compose the material, or may produce a metallic material with unstable properties or with an undesired corrosion resistance.

Advantages provided by the above embodiment are as follows. The electrode film 13 as the stamper-forming thin film according to the embodiment is made of the stamper-forming electrode material (metallic material) containing Cu, Ag, and Ti. This material containing Cu, Ag, and Ti, due to its high corrosion resistance to electron-attracting elements such as chlorine, sulphur and fluorine, or substances having such elements as electron-attracting groups, prevents damage, such as deterioration, to the electrode film 13 during formation of the Ni metallic layer 14 by electroforming. Since the surface of the projected pattern 16 on the stamper 15 is formed of this electrode film 13, the same surface can be maintained as smooth and planar as it is when the grooved pattern 12b of the resist film 12 has been transferred accurately to the electrode film 13. Thus, the substrate 21 of the optical disk 20 prepared by such a stamper 15 is provided with the grooved pattern 21a exactly identical with the grooved pattern 12b of the resist film 12, as well as smooth and planar inside surfaces in the grooves of the pattern 21a. These smooth and planar surfaces suppress irregular reflection of laser light emitted from an optical pickup for reading data recorded on the optical disk 20, to improve the signal-to-noise ratio (SNR), whereby the optical disk 20 can maintain high performance.

The Ag and Ti contents in the stamper-forming electrode material are set to 10.0 wt % or less and 5.0 wt % or less, respectively, whereby the corrosion resistance of the electrode film 13 can be further improved synergistically.

EXAMPLES

The above embodiment will be described more specifically with reference to illustrative non-limiting examples and a comparative example which follow.

Example 1

An electrode film 13 containing two kinds of elements, Cu and Ag, was formed on a quartz substrate using an RF sputtering system. Specifically, two kinds of sputtering targets, Cu and Ag, were disposed in the RF sputtering system for simultaneous deposition on the substrate by sputtering to form the electrode film 13 on the substrate. The Cu and Ag contents were adjusted by controlling ejection of their metallic atoms, and this ejection control was performed by adjusting RF power to be applied to the respective sputtering targets. Each sputtering target was 7.62 cm (3 inches) in diameter and 5 mm in thickness, and its distance to the substrate was about 90 cm. The film was formed under a vacuum of $3\times10^{-5}$ Pa, a gas pressure of 0.7–1.0 Pa, and an RF power of 100–500W.

Example 2

Two kinds of sputtering targets, Cu and Ti, were used for sputtering to form an electrode film 13 while controlling ejection of their metallic atoms similarly to Example 1.

Example 3

Three kinds of sputtering targets, Cu, Ag, and Ti, were used for sputtering to form an electrode film 13 while controlling ejection of their metallic atoms similarly to Example 1.

Comparative Example 1

An electrode film 13 containing only Cu was formed on a quartz substrate using the RF sputtering system. Specifically, a Cu sputtering target, which was 7.62 cm (3 inches) in diameter and 5 mm in thickness, was disposed in the RF sputtering system to be sputtered at a distance of about 90 cm to the substrate. The film was formed under a vacuum of $3\times10^{-5}$ Pa, a gas pressure of 0.7–1.0 Pa, and an RF power of 100–500W.

Evaluation of Corrosion Resistance

The electrode films 13 obtained as Examples 1 to 3 and Comparative Example 1 were immersed in an aqueous sodium chloride (NaCl) solution whose concentration was 5 percent by volume (vol %), together with the quarts substrates, at room temperature for predetermined times, for evaluation to see if their surfaces changed with time. Table 1 shows the results. The chemical composition of each metallic material, i.e., the contents of its constituent metallic elements are indicated on a wt % basis. The changes with time were visibly evaluated by those responsible for measurement. In the following tables, "G" denotes no deterioration on the electrode film 13 surface, "OK" denotes slight deterioration on the electrode film 13 surface, and "NG" denotes deterioration on the electrode film 13 surface, during measurement. The aqueous NaCl solution was used to verify the assumption that chlorine and sodium to be contained in an arbitrarily selected resist material would corrode the electrode film 13.

TABLE 1

| | Composition (wt %) | | | Immersion time (minutes) | | |
|---|---|---|---|---|---|---|
| Sample No. | Cu | Ag | Ti | 30 | 60 | 120 |
| Example 1 | 90 | 10 | — | OK | — | — |
| Example 2 | 95 | — | 5 | OK | — | — |
| Example 3 | 85 | 10 | 5 | G | NG | — |

TABLE 1-continued

| | Composition (wt %) | | | Immersion time (minutes) | | |
|---|---|---|---|---|---|---|
| Sample No. | Cu | Ag | Ti | 30 | 60 | 120 |
| Comparative Example 1 | 100 | — | — | NG | — | — |

As is apparent from the results of Table 1, in Examples 1 and 2, the electrode films 13 deteriorated from a 30-minute immersion to make part of their surfaces slightly cloudy. In Comparative Example 1, the electrode film 13 deteriorated from a 30-minute immersion to make its entire surface cloudy. In Example 3, the surface of the electrode film 13 did not deteriorate from a 30-minute immersion, but became cloudy from a 60-minute immersion.

A comparison between Examples 2 and 3 shows that Example 3 had a higher corrosion resistance than Example 2 due to Example 3 containing Ag and Example 2 not containing Ag, despite the fact that both contained 5 wt % Ti. This teaches that addition of Ag and Ti to the metallic material containing Cu as its main ingredient contributes to improving corrosion resistance and that the Ti content should be set preferably to 5.0 wt % or less.

However, some inconvenience was encountered in Example 3. Although the electrode film 13 contained 10 wt % Ag and 5 wt % Ti, its surface deteriorated from immersion lasting 60 minutes. To eliminate this inconvenience, optimum conditions for preparing an electrode film 13 were sought in the following examples.

Examples 4–10

Electrode films 13 according to Examples 4 to 10 were formed each by sputtering Cu, Ag, and Ti while controlling ejection of their metallic atoms similarly to Example 1, provided that the Ti content was fixed at 0.1 wt % for Examples 4 to 6 and at 0.5 wt % for Examples 7 to 10, while the Ag content was varied for all these examples. The resultant electrode films 13 were similarly evaluated for their corrosion resistance. Table 2 shows the results.

TABLE 2

| | Composition (wt %) | | | Immersison time (minutes) | | |
|---|---|---|---|---|---|---|
| Sample No. | Cu | Ag | Ti | 30 | 60 | 120 |
| Example 4 | 89.9 | 10 | 0.1 | NG | — | — |
| Example 5 | 79.9 | 20 | 0.1 | NG | — | — |
| Example 6 | 69.9 | 30 | 0.1 | NG | — | — |
| Example 7 | 69.5 | 30 | 0.5 | NG | — | — |
| Example 8 | 79.5 | 20 | 0.5 | NG | — | — |
| Example 9 | 89.5 | 10 | 0.5 | G | NG | — |
| Example 10 | 94.5 | 5 | 0.5 | G | NG | — |

As is apparent from Table 2, in Examples 4 to 8, the electrode films 13 deteriorated from a 30-minute immersion to make their surfaces cloudy, and so did the electrode films 13 according to Examples 9 and 10 from a 60-minute immersion. Since the surfaces of the films 13 according to Examples 5 to 8 wherein the Ag content was higher than 10 wt % became cloudy when immersed only for 30 minutes, it is taught that the Ag content should be set preferably to 10.0 wt % or less.

On the other hand, a comparison between Examples 4 and 9 shows that Example 9 had a higher corrosion resistance than Example 4 despite the fact that both contained 10 wt % Ag. This teaches that the Ag content should be set preferably to about 20 times the Ti content when the Cu content is in the order of 90 wt %.

Based on the above teachings, further optimum conditions for preparing an electrode film 13 were sought in the following examples.

Examples 11–17

Electrode films 13 according to Examples 11 to 17 were formed each by sputtering Cu, Ag, and Ti, while varying the Ag and Ti contents and controlling ejection of their metallic atoms similarly to Example 1, provided that the Ag content was varied up to 10 wt %. These electrode films 13 were immersed in a 5 vol % aqueous NaCl solution at room temperature until their surfaces deteriorated, similarly to the above measurement of corrosion resistance. For evaluation, how long it took before each film surface deteriorated was measured as "salt water resistance time." Measurements were taken from these examples as well as Examples 3, 9 and 10 that exhibited almost satisfactory corrosion resistance. Table 3 shows the results.

TABLE 3

| Sample No. | Composition (wt %) | | | Salt water resistance time (minutes) |
| --- | --- | --- | --- | --- |
| | Cu | Ag | Ti | |
| Example 3 | 85 | 10 | 5 | 40 |
| Example 9 | 89.5 | 10 | 0.5 | 40 |
| Example 10 | 94.5 | 5 | 0.5 | 50 |
| Example 11 | 94 | 4 | 2 | 50 |
| Example 12 | 97 | 2 | 1 | 120 |
| Example 13 | 98.5 | 1 | 0.5 | 180 |
| Example 14 | 98.5 | 0.9 | 0.6 | 180 |
| Example 15 | 98.9 | 0.9 | 0.2 | 120 |
| Example 16 | 99.45 | 0.45 | 0.1 | 180 |
| Example 17 | 99.7 | 0.2 | 0.1 | 90 |

As is apparent from Table 3, in Examples 3 and 9, the surfaces of their electrode films 13 deteriorated from a 40-minute immersion. In Examples 10 and 11, the surfaces of their electrode films 13 deteriorated from a 50-minute immersion, exhibiting a better corrosion resistance than Examples 3 and 9. In Examples 12 to 17, all the films resisted salt water for 90 minutes or longer, exhibiting an even better corrosion resistance. Particularly, Examples 13, 14, and 16 exhibited the best corrosion resistance, with their salt water resistance time lasting 180 minutes.

A comparison between Examples 9 and 10 based on the above findings shows that Example 10 had a higher corrosion resistance than Example 9 despite the fact that both contained 0.5 wt % Ti. This teaches that the Ag content should be set preferably to 5.0 wt % or less. Another comparison among Examples 11 to 13 whose Ag content was 5.0 wt % or less suggests that the Ti content be set preferably to 2.0 wt % or less, considering the fact that all of their electrode films resisted salt water for 50 minutes or longer.

Still another comparison between Examples 10 and 13 shows that Example 13 had an extremely higher corrosion resistance than Example 10 despite the fact that both contained 0.5 wt % Ti. In Example 10, the Ag content was 10 times the Ti content, while in Example 13, the former was merely twice the latter. This further suggests that the Ag content be set preferably to about twice the Ti content.

Even another comparison among Examples 11 to 13 based on the above suggestion that the Ag content preferably be about twice the Ti content shows that only Examples 12 and 13 exhibited a long salt water resistance time exceeding 100 minutes, despite the fact that all of Examples 11 to 13 contained Ag twice as much as Ti. This suggests that the Ti content be set more preferably to 1.0 wt % or less. Checking Examples 14 to 16 whose Ti content was equal to or smaller than 1.0 wt %, based on the above suggestion, it is shown that all of these examples exhibited a salt water resistance time exceeding 100 minutes as well as good corrosion resistance, and this hence justifies the above suggestion that the Ti content be set more preferably to 1.0 wt % or less.

In addition, it is of note that the electrode film of Example 17, although containing Ag twice as much as Ti, exhibited the lowest corrosion resistance among Examples 12 to 17 with a salt water resistance time of 90 minutes. By merging this with the above findings as to Examples 13, 14, and 16, it is taught that a better corrosion resistance can be given to the electrode film 13 when the content of Cu, its main ingredient, is set to 97–99.5 wt % and the Ag content is set to 1.5–4.5 times the Ti content.

As alternatives, this embodiment may be modified as follows. As to the substrate 21, the reflector film 22, and the protective layer 23, although the optical disk 20 according to this embodiment includes only one layer each, an optical disk 20 may also include two or more layers each.

Additionally, the following are some technical ideas which could be taught by the above embodiments or examples.

(1) A stamper-forming electrode material, wherein the material contains Ag in an amount of 5.0 wt % or less and Ti in an amount of 2.0 wt % or less. According to this arrangement, a better corrosion resistance can be given to a stamper-forming thin film for forming a stamper.

(2) A stamper-forming electrode material mentioned in (1) above, wherein the material contains Ti in an amount of 1.0 wt % or less. According to this arrangement, an even better corrosion resistance can be given to a stamper-forming thin film for forming a stamper.

(3) A stamper-forming electrode material mentioned in (1) or (2) above, wherein the material contains Cu in an amount of 97–99.5 wt %, and Ag and Ti such that the ratio in terms of content of Ag to Ti is set to 1.5–4.5 on a weight basis. According to this arrangement, an even better corrosion resistance can be given to a stamper-forming thin film for forming a stamper.

(4) A stamper-forming thin film comprising the stamper-forming electrode material mentioned in any of (1) to (3) above. According to this arrangement, a further better corrosion resistance can be given to the stamper-forming thin film for forming a stamper.

(5) A method of manufacturing an optical disk, wherein the stamper-forming electrode material contains Ag in an amount of 5.0 wt % or less and Ti in an amount of 2.0 wt % or less. According to this arrangement, a better corrosion resistance can be given to a stamper-forming thin film for forming a stamper.

(6) A method of manufacturing an optical disk, wherein the stamper-forming electrode material contains Ag in an amount of 5.0 wt % or less and Ti in an amount of 1.0 wt % or less. According to this arrangement, an even better corrosion resistance can be given to a stamper-forming thin film for forming a stamper.

(7) A method of manufacturing an optical disk according to claim 6 or 7, wherein the stamper-forming electrode material contains Cu, Ag, and Ti, and the content of Cu is set to 97–99.5 wt %, and the ratio in terms of content of Ag to Ti is set to 1.5–4.5 on a weight basis. According to this arrangement, an even better corrosion resistance can be given to a stamper-forming thin film for forming a stamper.

The invention may be embodied in other specific forms without departing from the spirit or essential characteristics thereof. The present embodiments are therefore to be considered in all respects as illustrative and not restrictive, the scope of the invention being indicated by the appended claims rather than by the forgoing description and all changes which come within the meaning and range of equivalency of the claims are therefore intended to be embraces therein.

The entire disclosure of Japanese Patent Applications Nos. 2001-28454 and 2001-28455 filed on Feb. 5, 2001 including the specifications, claims, drawings and summaries is incorporated herein by reference in its entirety.

What is claimed is:

1. A stamper that constitutes a stamper-forming thin film and a metallic layer which was formed on a surface of a resist film patterned on a supporting plate, for forming a stamper by stacking the metallic layer on a surface of said stamper-forming thin film by electroforming using said stamper-forming thin film as an electrode, and thereafter by separating said metallic layer from said resist film, together with said stamper-forming thin film, wherein said material contains copper (Cu) as a main ingredient thereof and at least one of silver (Ag) in an amount of 10.0 wt % or less and titanium (Ti) in an amount of 5.0 wt % or less.

2. A stamper-forming thin film coated on a surface of a resist film patterned on a supporting plate, constituting a stamper-forming electrode material for forming a stamper by stacking a metallic layer on a surface of said stamper-forming thin film by electroforming using said stamper-forming thin film as an electrode, and thereafter by separating said metallic layer from said resist film, together with said stamper-forming thin film, wherein said material thin film contains copper (Cu) as a main ingredient thereof and at least one other element selected from silver (Ag) in an amount of 10.0 wt % or less and titanium (Ti) in an amount of 5.0 wt % or less.

3. A method of manufacturing an optical disk comprising the steps of:

forming a resist film on a surface of a supporting plate;

forming a predetermined pattern on said resist film by exposure to an electron beam;

forming a stamper-forming thin film made of a stamper-forming electrode material on a surface of said patterned resist film;

stacking a metallic layer on a surface of said stamper-forming thin film by electroforming using said stamper-forming thin film as an electrode, and thereafter by separating said metallic layer from said resist film, together with said stamper-forming thin film, to form a stamper;

inject ion-molding a substrate made of a synthetic resin using said stamper as a mold; and stacking a reflector film and a protective layer on a surface of said substrate to manufacture said optical disk, wherein said stamper-forming electrode material of which said stamper-forming thin film is made contains Cu as a main ingredient and has at least one other element selected from silver (Ag) in an amount of 10.0 wt % or less and titanium (Ti) in an amount of 5.0 wt % or less.

* * * * *